United States Patent
Shim et al.

(10) Patent No.: US 10,063,259 B2
(45) Date of Patent: Aug. 28, 2018

(54) INTERLEAVING METHOD AND APPARATUS FOR ADAPTIVELY DETERMINING INTERLEAVING DEPTH

(71) Applicant: Samsung Electronics Co., Ltd., Suwon-si (KR)

(72) Inventors: Jaewook Shim, Yongin-si (KR); Chang Soon Park, Chungju-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 9 days.

(21) Appl. No.: 14/944,428

(22) Filed: Nov. 18, 2015

(65) Prior Publication Data
US 2016/0182090 A1 Jun. 23, 2016

(30) Foreign Application Priority Data

Dec. 17, 2014 (KR) .................... 10-2014-0182379

(51) Int. Cl.
*H03M 13/00* (2006.01)
*H03M 13/27* (2006.01)

(52) U.S. Cl.
CPC ... *H03M 13/2707* (2013.01); *H03M 13/2789* (2013.01); *H03M 13/6356* (2013.01); *H03M 13/6508* (2013.01)

(58) Field of Classification Search
None
See application file for complete search history.

(56) References Cited

U.S. PATENT DOCUMENTS

| | | | | |
|---|---|---|---|---|
| 5,928,371 A | * | 7/1999 | Robinson, Jr. | ........ H04L 1/0071 714/702 |
| 6,151,690 A | | 11/2000 | Peeters | |
| 6,536,001 B1 | * | 3/2003 | Cai | .................. H03M 13/2732 714/701 |
| 6,697,993 B1 | | 2/2004 | Lopez | |
| 7,873,779 B2 | | 1/2011 | Maddali et al. | |
| 8,015,475 B2 | * | 9/2011 | Lu | ..................... H03M 13/1515 714/761 |

(Continued)

FOREIGN PATENT DOCUMENTS

| | | |
|---|---|---|
| JP | 4166742 B2 | 10/2008 |
| KR | 10-0533592 B1 | 12/2005 |

(Continued)

OTHER PUBLICATIONS

Haykin, Simon. "Communication systems. Simon Haykin." New York [etc.]: John Wiley & Sons, cop (2001). (838 Pages in English).

*Primary Examiner* — Daniel McMahon
(74) *Attorney, Agent, or Firm* — NSIP Law

(57) ABSTRACT

An interleaving method and apparatus for adaptively determining an interleaving depth of each of one or more interleaving blocks based on a maximum interleaving depth and a number of codewords of a packet, and interleaving the interleaving blocks based on the interleaving depth. The adaptively determining the interleaving depth includes: calculating a number of remaining codewords by performing a modulo operation on a basic interleaving depth and the number of the codewords; and determining the interleaving depth by adjusting the basic interleaving depth based on the number of the remaining codewords.

16 Claims, 14 Drawing Sheets

(56) References Cited

U.S. PATENT DOCUMENTS

| | | | |
|---|---|---|---|
| 8,156,778 B2* | 4/2012 | Mantri | H04L 1/0041 375/219 |
| 8,351,537 B2 | 1/2013 | Heise | |
| 8,898,533 B2* | 11/2014 | Christiaens | H04L 1/0041 714/748 |
| 2002/0188905 A1* | 12/2002 | Hollums | G06F 11/1008 714/752 |
| 2003/0225958 A1* | 12/2003 | Efland | G06F 9/52 711/1 |
| 2007/0186139 A1* | 8/2007 | Kim | H03M 13/2789 714/758 |
| 2012/0198307 A1* | 8/2012 | Kibe | H03M 13/11 714/758 |

FOREIGN PATENT DOCUMENTS

| | | |
|---|---|---|
| KR | 10-2009-0009071 A | 1/2009 |
| KR | 10-0922734 B1 | 10/2009 |
| KR | 10-2009-0125080 A | 12/2009 |
| KR | 10-0970734 B1 | 7/2010 |
| KR | 10-1290472 B1 | 7/2013 |
| KR | 10-2014-0036346 A | 3/2014 |

* cited by examiner $d_{max}$ : 5
$d$     : 4
$N_B$   : 1

1410

1420

INTERLEAVING METHOD AND APPARATUS FOR ADAPTIVELY DETERMINING INTERLEAVING DEPTH

CROSS-REFERENCE TO RELATED APPLICATION(S)

This application claims the benefit under 35 USC 119(a) of Korean Patent Application No. 10-2014-0182379 filed on Dec. 17, 2014, in the Korean Intellectual Property Office, the entire disclosure of which is incorporated herein by reference for all purposes.

BACKGROUND

1. Field

The following description relates to an interleaving method and apparatus for adaptively determining an interleaving depth.

2. Description of Related Art

An effort to overcome a nonideal channel environment has been made, and studies have been conducted on various schemes for transmission and reception signal processing with a faster speed and a higher reliability. In particular, a large amount of research has been conducted on a scheme of transmitting and receiving digital bit information using a more effective modulation and demodulation scheme.

Additionally, error correcting code technology is used as one of effective technologies to enhance a communication reliability in a digital communication system. For example, intact transmitted bit information may not be received at a receiver due to various nonideal communication channel environments as well as random noise, and an error may occur. In this example, the error correcting code technology may detect and correct the error and may restore the original bit information desired to be transmitted and thus, the communication reliability may be enhanced.

Also, an interleaving scheme of interleaving a codeword block is used to enhance the communication reliability in the digital communication system. The interleaving scheme may improve a digital communication even in the occurrence of an error by interleaving a codeword block based on a preset interleaving depth and transmitting the interleaved codeword block.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

In one general aspect, there is provided an interleaving method including adaptively determining an interleaving depth of each of one or more interleaving blocks based on a maximum interleaving depth and a number of codewords of a packet, and interleaving the interleaving blocks based on the interleaving depth.

The maximum interleaving depth may be a value set in advance between a transmitter configured to transmit the interleaving blocks and a receiver configured to receive the interleaving blocks.

The determining the interleaving depth may include calculating a number of remaining codewords by performing a modulo operation on a basic interleaving depth and the number of the codewords, and determining the interleaving depth by adjusting the basic interleaving depth based on the number of the remaining codewords.

The interleaving method may further include determining the basic interleaving depth based on an environment of a communication channel through which the interleaving blocks are transmitted.

The determining may include determining the interleaving depth based on a sum of the number of the remaining codewords and the basic interleaving depth.

The interleaving blocks may include a plurality of interleaving blocks. The determining of the interleaving depth may include, in response to the sum being equal to or less than the maximum interleaving depth, determining, to be the sum, an interleaving depth of a last interleaving block to be generated, and determining an interleaving depth of each of interleaving blocks other than the last interleaving block to be the basic interleaving depth.

The interleaving may include interleaving the last interleaving block based on a same number of codewords as the sum, and interleaving the other interleaving blocks based on the same number of codewords as the basic interleaving depth.

The determining may include determining a maximum number of dummy codewords based on the number of the codewords, in response to the sum exceeding the maximum interleaving depth, the dummy codewords being added to the codewords, and determining the interleaving depth to be the basic interleaving depth, in response to a difference between the basic interleaving depth and the number of the remaining codewords being equal to or less than the maximum number of dummy codewords, and The interleaving may include interleaving the interleaving blocks by adding the same number of dummy codewords as the difference to the codewords.

The dummy codewords may be generated by zero padding.

The interleaving blocks may include a plurality of interleaving blocks. The determining of the interleaving depth may include determining a maximum number of dummy codewords based on the number of the codewords, in response to the sum exceeding the maximum interleaving depth, the dummy codewords being added to the codewords, classifying the interleaving blocks into two groups, in response to a difference between the basic interleaving depth and the number of the remaining codewords exceeding the maximum number of dummy codewords, and determining different interleaving depths of the two groups.

The interleaving may include adding the same number of dummy codewords as the maximum number of dummy codewords to the codewords, and interleaving the interleaving blocks by applying the different interleaving depths to the two groups.

A difference between the different interleaving depths of the two groups may be "1."

An interleaving depth of a preceding group among the two groups may be greater than an interleaving depth of a following group.

The determining of the different interleaving depths may include, in response to last two interleaving blocks among the interleaving blocks being included in a first group, and the other interleaving blocks being included in a second group, determining an interleaving depth of each of the interleaving blocks in the second group to be the basic interleaving depth, and determining an interleaving depth of each of the interleaving blocks in the first group, based on the basic interleaving depth, a number of remaining codewords, and the number of the added dummy codewords.

In response to a sum of the basic interleaving depth, the number of the remaining codewords, and the number of the added dummy codewords being an even number, the interleaving blocks in the first group may be determined to have identical interleaving depths.

The adaptively determining may include determining a number of dummy codewords added to the codewords, in response to the number of the codewords being less than a predetermined basic interleaving depth, and determining the interleaving depth to be a sum of the number of the codewords and the number of the dummy codewords.

The interleaving may include, in response to a single interleaving block existing, interleaving the interleaving block based on the number of the codewords and the number of the dummy codewords.

In another general aspect, there is provided an interleaving apparatus including an interleaving depth determiner configured to adaptively determine an interleaving depth of each of one or more interleaving blocks based on a maximum interleaving depth and a number of one or more codewords of a packet, and an interleaver configured to interleave the interleaving blocks based on the interleaving depth.

Other features and aspects will be apparent from the following detailed description, the drawings, and the claims.

Figure 1:
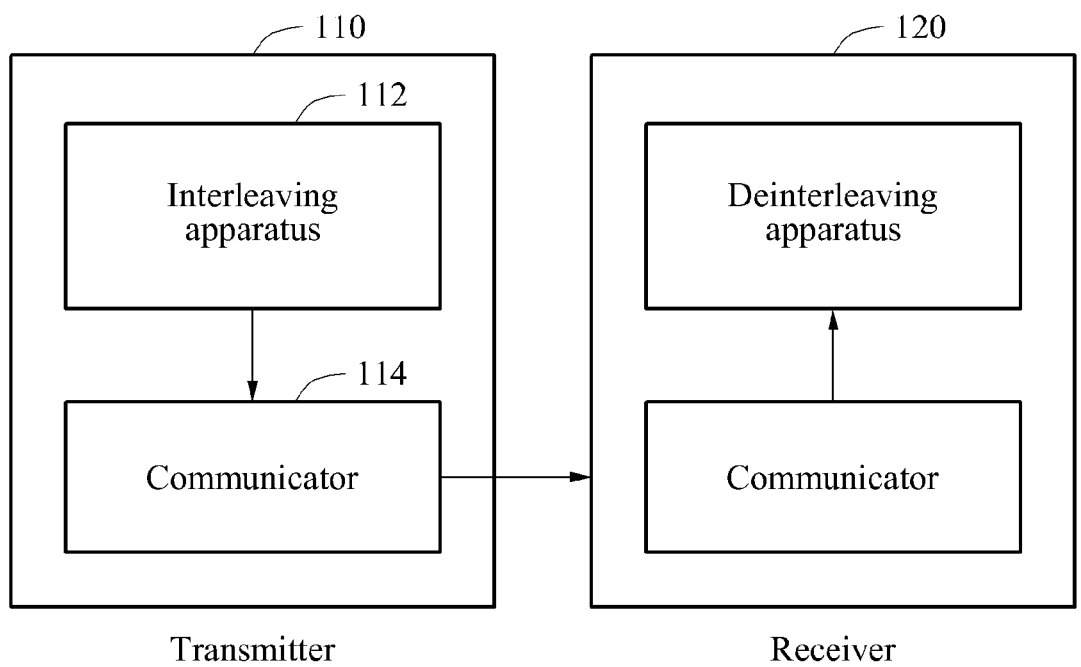
FIG. 1 illustrates an example of a system for transmitting an interleaving block.

Throughout the drawings and the detailed description, unless otherwise described or provided, the same drawing reference numerals will be understood to refer to the same elements, features, and structures. The drawings may not be to scale, and the relative size, proportions, and depiction of elements in the drawings may be exaggerated for clarity, illustration, and convenience.

DETAILED DESCRIPTION

The following detailed description is provided to assist the reader in gaining a comprehensive understanding of the methods, apparatuses, and/or systems described herein. However, various changes, modifications, and equivalents of the systems, apparatuses and/or methods described herein will be apparent to one of ordinary skill in the art. The progression of processing steps and/or operations described is an example; however, the sequence of and/or operations is not limited to that set forth herein and may be changed as is known in the art, with the exception of steps and/or operations necessarily occurring in a certain order. Also, descriptions of functions and constructions that are well known to one of ordinary skill in the art may be omitted for increased clarity and conciseness.

The features described herein may be embodied in different forms, and are not to be construed as being limited to the examples described herein. Rather, the examples described herein have been provided so that this disclosure will be thorough and complete, and will convey the full scope of the disclosure to one of ordinary skill in the art.

Hereinafter, exemplary embodiments will be described in detail with reference to the accompanying drawings, wherein like reference numerals refer to like elements throughout.

Various alterations and modifications may be made to the exemplary embodiments, some of which will be illustrated in detail in the drawings and detailed description. However, it should be understood that these embodiments are not construed as limited to the illustrated forms and include all changes, equivalents or alternatives within the idea and the technical scope of this disclosure.

The terminology used herein is for the purpose of describing particular embodiments only and is not intended to be limiting of the invention. As used herein, the singular forms "a," "an" and "the" are intended to include the plural forms as well, unless the context clearly indicates otherwise. It will be further understood that the terms "include" and/or "have," when used in this specification, specify the presence of stated features, integers, steps, operations, elements, components or combinations thereof, but do not preclude the presence or addition of one or more other features, integers, steps, operations, elements, components, and/or groups thereof.

Unless otherwise defined, all terms including technical and scientific terms used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Like reference numerals in the drawings denote like elements, and redundant descriptions of like elements will be omitted herein. When it is determined a detailed description of a related known function or configuration they may make the purpose of the present invention unnecessarily ambiguous in describing the present invention, the detailed description will be omitted herein.

FIG. 1 illustrates an example of a system for transmitting an interleaving block.

Referring to FIG. 1, the system for transmitting an interleaving block (hereinafter, referred to as a "system") includes a transmitter 110 and a receiver 120.

The transmitter 110 includes an interleaving apparatus 112 and a communicator 114. Although FIG. 1 illustrates the interleaving apparatus 112 and the communicator 114 included in the transmitter 110, these components may also be embodied as independent hardware. Therefore, the transmitter 110 illustrated in FIG. 1 is not limited thereto and thus may include more or less components.

The interleaving apparatus 112 interleaves one or more interleaving blocks based on data of a packet to be transmitted.

The communicator 114 transmits the interleaved interleaving blocks to the receiver 120.

For example, the communicator 114 may transmit interleaving blocks using a symbol coding scheme.

The receiver 120 receives the interleaved interleaving blocks from the transmitter 110. The receiver 120 may include, for example, a wired communication terminal or a wireless communication terminal, for example, a portable terminal.

A scheme of effectively detecting a transmission error occurring in a transmission process may be applied to one or more transmitted interleaving blocks.

A method of interleaving an interleaving block will be further described with reference to FIGS. 2 through 14.

Figure 2:
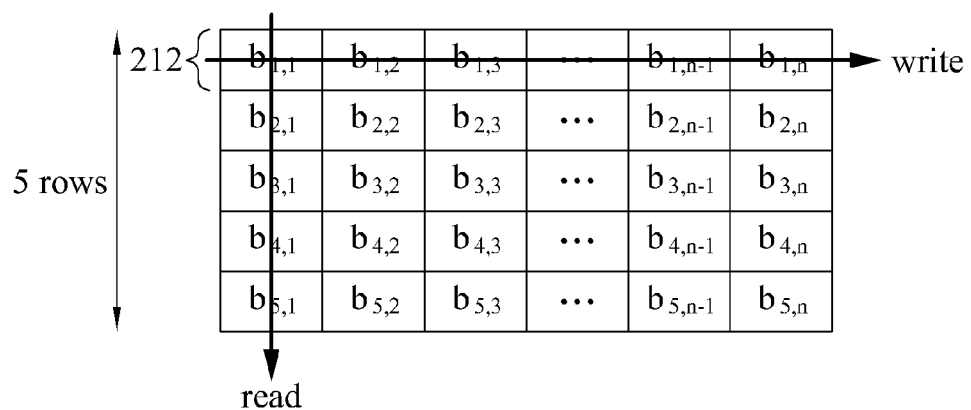
FIG. 2 illustrates an example of an interleaving block.

FIG. 2 illustrates an example of an interleaving block.

A codeword is obtained by dividing data of a packet to be transmitted. The packet has a predetermined size. In other words, one or more codewords may be collected to form a transmission packet.

For example, each codeword may include n bits in total. Among the n bits, "n−m" bits may be data of a packet, and m bits may be parity bits used to detect an error occurring during a transmission of the packet. In this example, n is a natural number, and m is an integer equal to or greater than "0."

When a number of parity bits increases, an error detection performance may be enhanced. Because a data rate relatively decreases as the number of parity bits increases, the number of parity bits may be determined based on a required error detection performance and the data rate.

A transmission error occurring in consecutive bits may not be detected even though a parity bit is used to detect the transmission error. When an error is not detected, the error may not be restored.

When an interleaving scheme is used, a transmission error occurring in consecutive bits may be detected.

Referring to FIG. 2, data 210 to be transmitted includes a plurality of codewords, that is, five codewords.

A first codeword 212 includes n bits, for example, bits $b_{1,1}$ through $b_{1,n}$. To normally read the data 210, the bits $b_{1,1}$ through $b_{1,n}$ in the first codeword 212 need to be sequentially read.

When the interleaving scheme is used, a transmission error occurring in each codeword may be detected by mixing bits of each of a plurality of codewords and transmitting the bits, instead of sequentially transmitting the bits, even though a transmission error occurs in consecutive bits.

For example, an interleaving method may consecutively transmit bits in a first column of each of the codewords in the data 210.

In accordance with one configuration, a block including a plurality of codewords may be referred to as an interleaving block or a block. A generated interleaving block may be transmitted in a unit of a column.

A unit of a column for transmission is defined as an interleaving depth or a depth. A maximum interleaving depth is defined as an interleaving depth to be processed by the interleaving apparatus 112 at a maximum level.

As described above, a parameter used to reduce a transmission error (for example, a number of parity bits, and the like), and a data rate-related parameter may have a trade-off relationship. An interleaving method based on the above relationship will be further described with reference to FIGS. 3 through 14.

Figure 3:
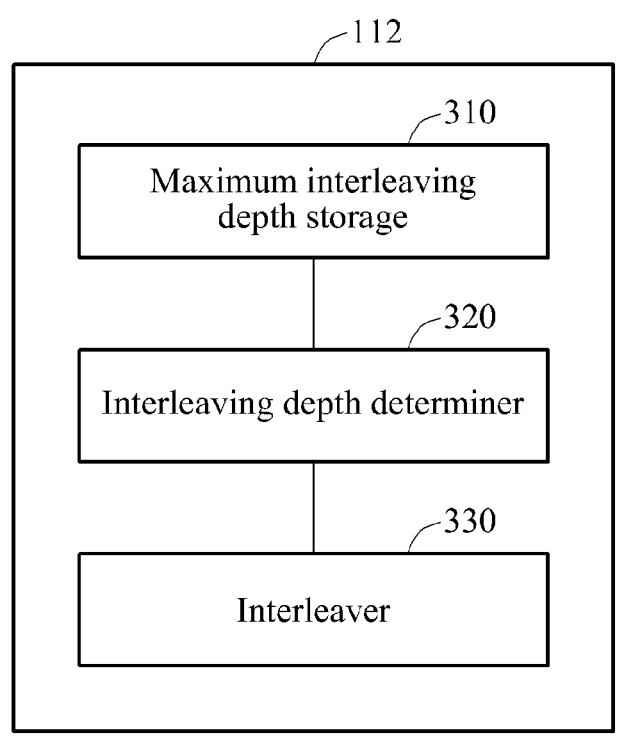
FIG. 3 illustrates an example of a configuration of an interleaving apparatus of FIG. 1.

FIG. 3 illustrates an example of a configuration of the interleaving apparatus 112 of FIG. 1.

Referring to FIG. 3, the interleaving apparatus 112 includes a maximum interleaving depth storage 310, an interleaving depth determiner 320, and an interleaver 330. Although FIG. 3 illustrates the maximum interleaving depth storage 310, the interleaving depth determiner 320, and the interleaver 330 included in the interleaving apparatus 112, these component may be embodied as independent hardware. Therefore, the interleaving apparatus 112 illustrated in FIG. 3 is not limited thereto and thus the interleaving apparatus may include more or less components.

The maximum interleaving depth storage 310, the interleaving depth determiner 320 and the interleaver 330 will be further described with reference to FIGS. 4 through 14.

Figure 4:
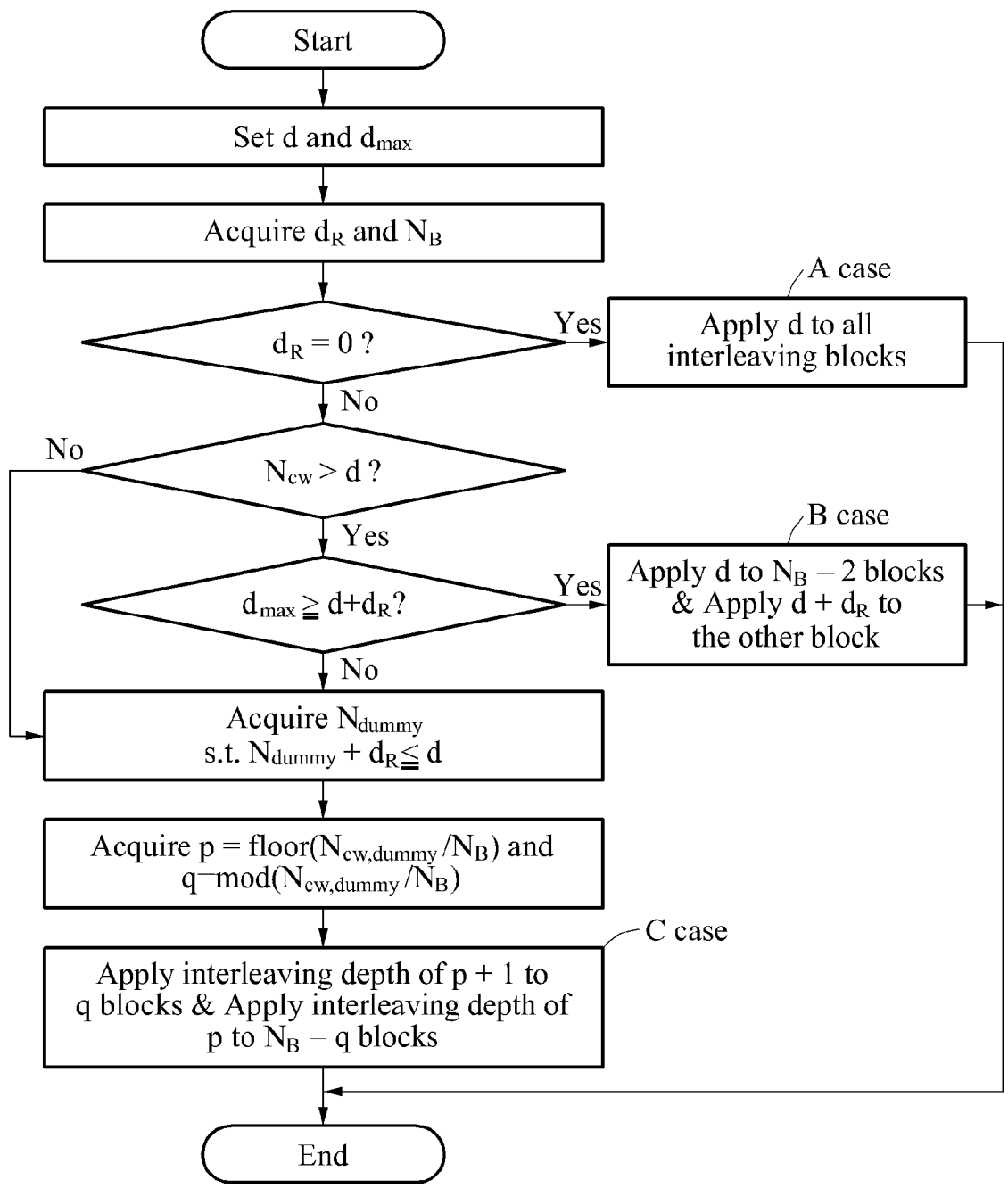
FIG. 4 illustrates an example of an interleaving method.

FIG. 4 illustrates an example of an interleaving method.

By operations of the interleaving method of FIG. 4, three cases, for example case A, case B and case C, may occur.

Case A will be further described with reference to FIG. 6.

Case B will be further described with reference to FIGS. 7 and 8.

Case C will be further described with reference to FIGS. 9 through 12.

Figure 5:
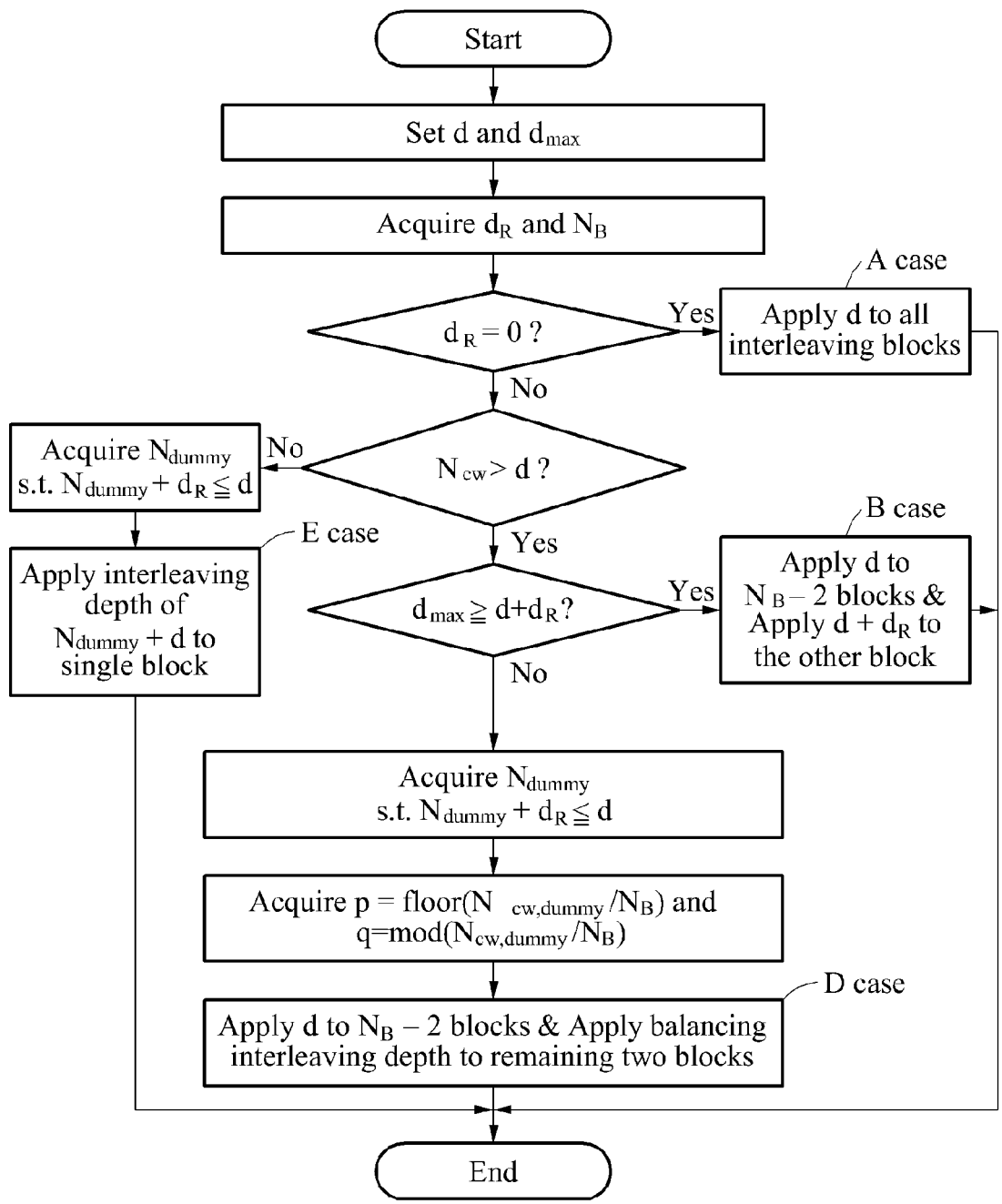
FIG. 5 illustrates another example of an interleaving method.

FIG. 5 illustrates another example of an interleaving method.

By operations of the interleaving method of FIG. 5, four cases, for example case A, case B, case D and case E, occur.

Case A and case B are identical to case A and case B of FIG. 4.

Case D will be further described with reference to FIGS. 11 and 12.

Case E will be further described with reference to FIGS. 13 and 14.

Figure 6:
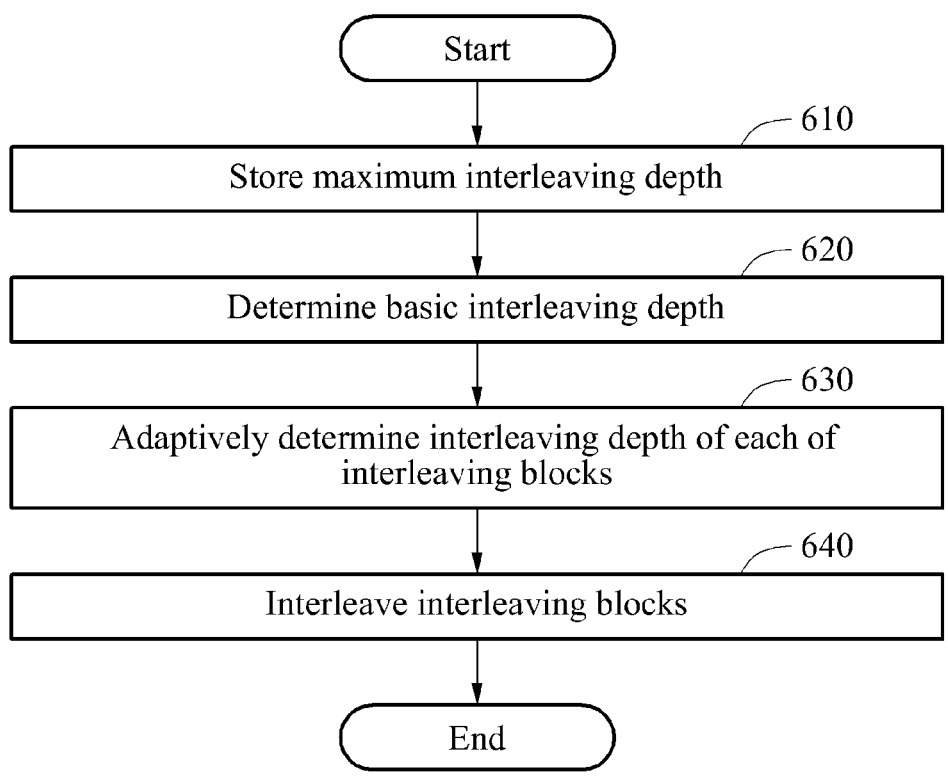
FIG. 6 illustrates an example of a method of interleaving an interleaving block.

FIG. 6 illustrates an example of a method of interleaving an interleaving block.

Referring to FIG. 6, in operation 610, the maximum interleaving depth storage 310 stores a maximum interleaving depth. The maximum interleaving depth may be represented by $d_{max}$. In an example, the maximum interleaving depth storage 310 may store a maximum interleaving depth set based on a performance of hardware of the interleaving apparatus 112. The performance of the hardware may be a processing performance of a memory of the interleaving apparatus 112. In another example, the maximum interleaving depth may be a value determined by performing an operation based on implementations.

In an example, the maximum interleaving depth may be stored in advance in the transmitter 110 and the receiver 120. The maximum interleaving depth may be, for example, a value set in advance between the transmitter 110 configured to transmit interleaving blocks and the receiver 120 configured to receive interleaving blocks.

In operation 620, the interleaving depth determiner 320 determines in advance a basic interleaving depth. The basic interleaving depth may be represented by d. The basic interleaving depth may be equal to or less than the maximum interleaving depth.

For example, the interleaving depth determiner 320 may determine the basic interleaving depth based on an environment of a communication channel through which interleaving blocks are transmitted. The interleaving depth determiner 320 may change the basic interleaving depth, in response to the environment of the communication channel being changed.

In operation 630, the interleaving depth determiner 320 adaptively determines an interleaving depth of each of one or more interleaving blocks. For example, the interleaving depth determiner 320 may adaptively determine the interleaving depth by adjusting the basic interleaving depth based on a condition.

In an example, the interleaving depth determiner 320 may adaptively determine an interleaving depth of each of blocks, based on the maximum interleaving depth and a number of one or more codewords in a packet.

A relationship between the number of the codewords, the basic interleaving depth and a number of remaining codewords is represented by Equation 1 shown below. An example of calculating the number of the remaining codewords will be further described with reference to operation 710 of FIG. 7.

$$N_{cw} = d \times (N_B - 1) + d_R \qquad \text{Equation 1}$$

In Equation 1, $d_R$ denotes the number of the remaining codewords, $N_{cw}$ denotes the number of the codewords, and d denotes the basic interleaving depth.

Additionally, $N_B$ denotes a number of one or more interleaving blocks generated based on the basic interleaving depth when the number of the remaining codewords is not zero.

In case A, the number of the remaining codewords is zero, and "$N_B-1$" interleaving blocks are generated.

An example of a scheme of adaptively determining an interleaving depth will be further described with reference to FIGS. 7 through 14.

In operation 640, the interleaver 330 interleaves the interleaving blocks based on the interleaving depth.

In a digital communication system, a variety of research and development activities are being conducted with the aim of an excellent reliability and a high data rate in a channel environment with various nonideal characteristics. Among these, when a multi-bit modulation and demodulation scheme and an error correcting code scheme are properly combined, an excellent performance may be obtained in terms of an increase in a reliability and a transmission rate. Conversely, when the multi-bit modulation and demodulation scheme and the error correcting code scheme are not properly combined, the above effect may be hardly obtained.

In an example, in the digital communication system, the multi-bit modulation and demodulation scheme and the error correcting code scheme may be effectively combined and thus, a reliability may be maximized.

In another example, in a real communication system that transmits and receives packets with various lengths, a degradation in a performance in a predetermined packet size may be prevented. An equal reliability may be ensured regardless of a packet size.

In still another example, the error correcting code scheme may be applicable to a reception error occurring between neighboring bits.

In case A in which the number of the remaining codewords is zero, the interleaver 330 interleaves the "$N_B-1$" interleaving blocks.

Examples of methods of interleaving blocks will be further described with reference to FIGS. 7 through 14. In the examples, a number of remaining codewords is not zero.

The description of FIGS. 1 through 5 is equally applicable to the method of FIG. 6 and accordingly, will not be repeated.

In case B, one or more codewords remain, and a sum of a number of the remaining codewords and a basic interleaving depth is equal to or less than a maximum interleaving depth.

Figure 7:
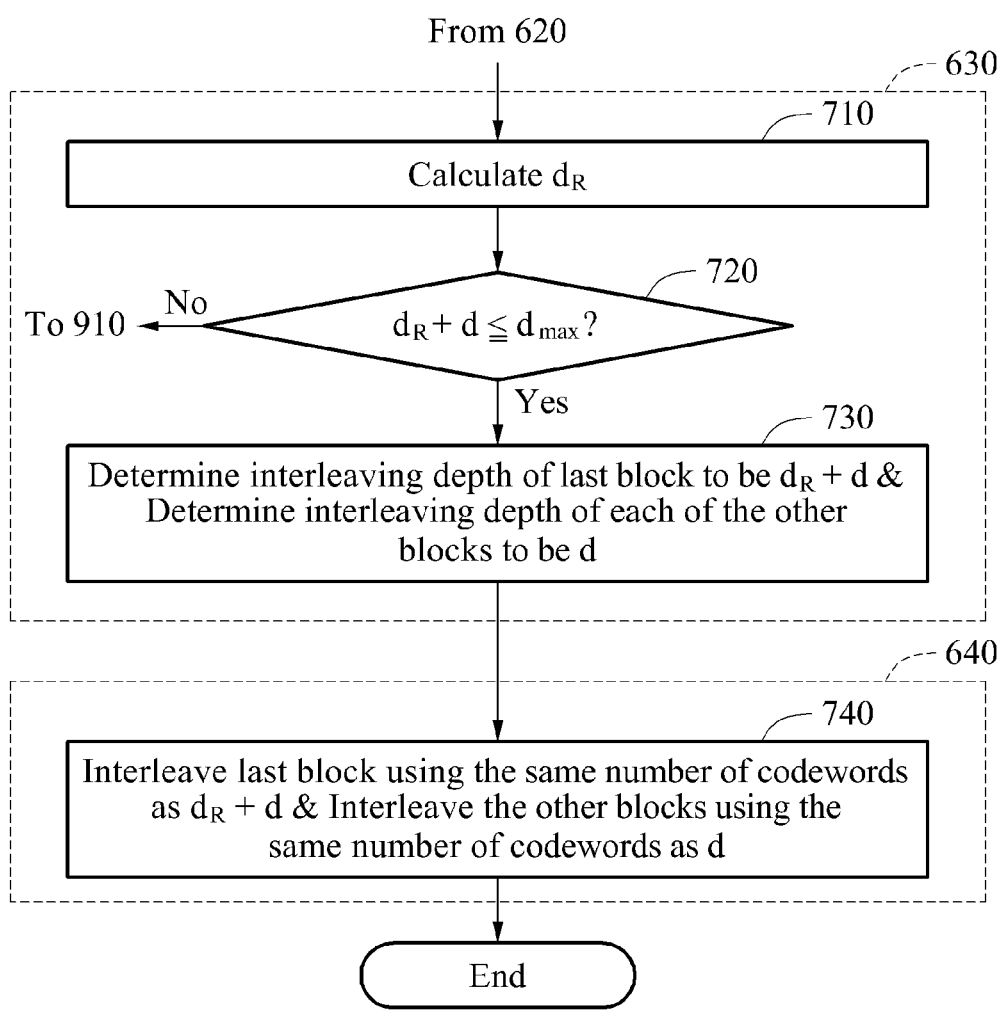
FIG. 7 illustrates an example of a method of performing interleaving when a sum of a number of remaining codewords and a basic interleaving depth is equal to or less than a maximum interleaving depth.

FIG. 7 illustrates an example of a method of performing interleaving when a sum of a number of remaining codewords and a basic interleaving depth is equal to or less than a maximum interleaving depth.

The method of FIG. 7 may be performed in the above-described case B.

Referring to FIG. 7, the operation of storing the maximum interleaving depth which corresponds to operation 630 of FIG. 6 includes operations 710 through 730.

In operation 710, the interleaving depth determiner 320 calculates the number of the remaining codewords $d_R$ by performing a modulo operation on the basic interleaving depth d and a number of codewords $N_{cw}$.

The modulo operation is represented by Equation 2 shown below.

$$d_R = \text{mod}(N_{cw}, d) \qquad \text{Equation 2}$$

In Equation 2, mod(x,y) denotes a modulo operation of x and y.

In operation 720, the interleaving depth determiner 320 compares the sum of the number of the remaining codewords $d_R$ and the basic interleaving depth d to the maximum interleaving depth $d_{max}$.

When the sum is equal to or less than the maximum interleaving depth, operation 730 is performed.

When the sum exceeds the maximum interleaving depth, operation 910 is performed. Operation 910 will be further described with reference to FIG. 9.

In operation 730, the interleaving depth determiner 320 determines, to be the sum, an interleaving depth of a last interleaving block to be generated. Also, the interleaving depth determiner 320 determines an interleaving depth of each of the other interleaving blocks to be the basic interleaving depth.

For example, when four interleaving blocks are generated by applying the basic interleaving depth to all interleaving blocks, that is, when $N_B$ is "4," and when operation 730 is performed, an interleaving depth of a last interleaving block is determined by merging a third interleaving block and a fourth interleaving block.

The operation of interleaving the interleaving blocks which corresponds to operation 640 of FIG. 6 includes operation 740.

In operation 740, the interleaver 330 interleaves the last interleaving block using the same number of codewords as the sum.

The interleaver 330 also interleaves the other interleaving blocks using the same number of codewords as the basic interleaving depth.

The description of FIGS. 1 through 6 is equally applicable to the method of FIG. 7 and accordingly, will not be repeated.

Figure 8:
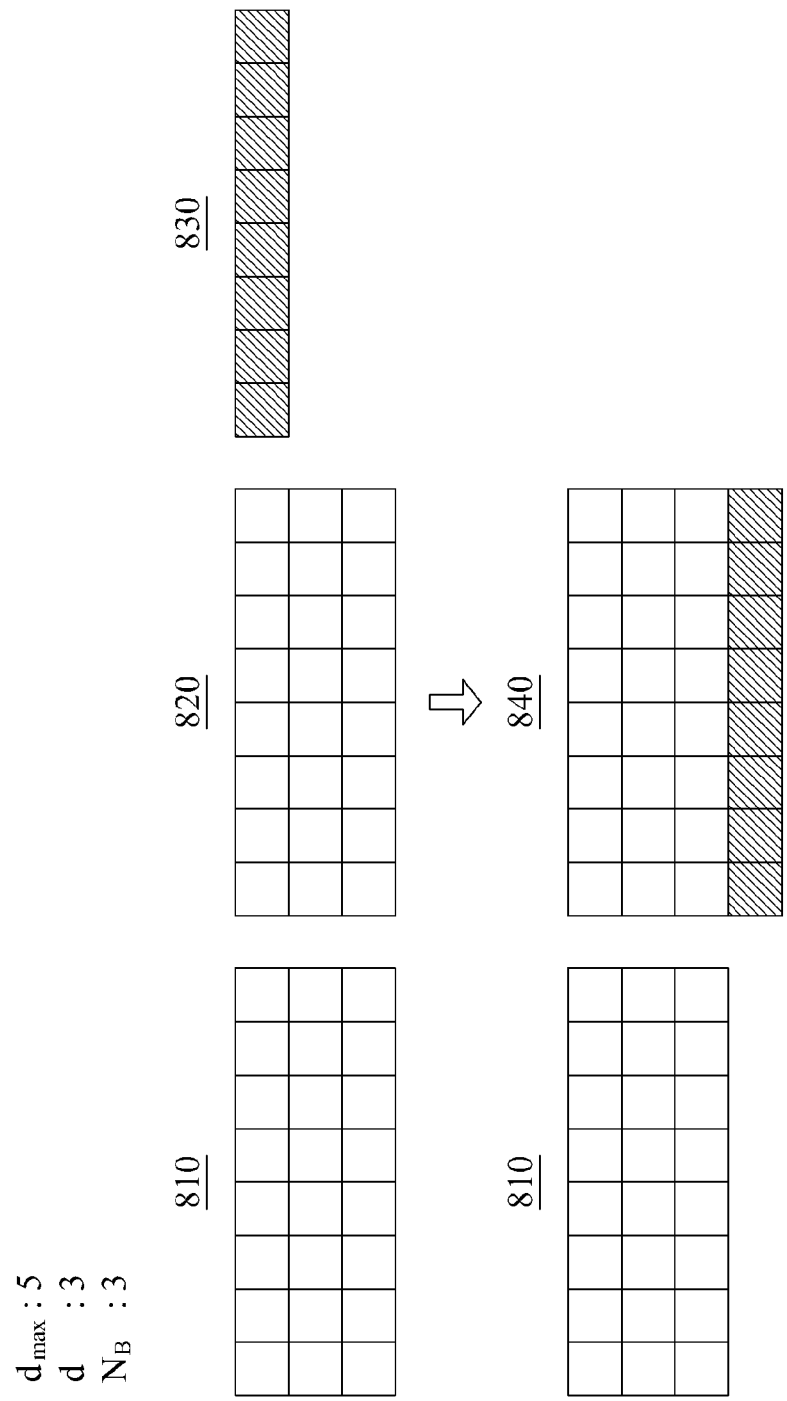
FIG. 8 illustrates an example of interleaving blocks generated when the sum of the number of the remaining codewords and the basic interleaving depth is equal to or less than the maximum interleaving depth.

FIG. 8 illustrates an example of interleaving blocks generated when the sum of the number of the remaining codewords and the basic interleaving depth is equal to or less than the maximum interleaving depth.

For example, when the maximum interleaving depth $d_{max}$ is set to "5," when the basic interleaving depth d is set to "3," when ten codewords exist, a single codeword remains.

Blocks 810 through 830 are interleaving blocks generated based on the basic interleaving depth. The block 830 includes a remaining codeword.

Because the sum of the number of the remaining codewords and the basic interleaving depth is less than the maximum interleaving depth, an interleaving depth of a last block 840 is determined to be the sum. Accordingly, the last block 840 is generated by merging the blocks 820 and 830.

The description of FIGS. 1 through 7 is equally applicable to the example of FIG. 8 and accordingly, will not be repeated.

In case C, a dummy codeword is added to fill a last block, that is, "$d_R + N_{dummy} = d$."

Figure 9:
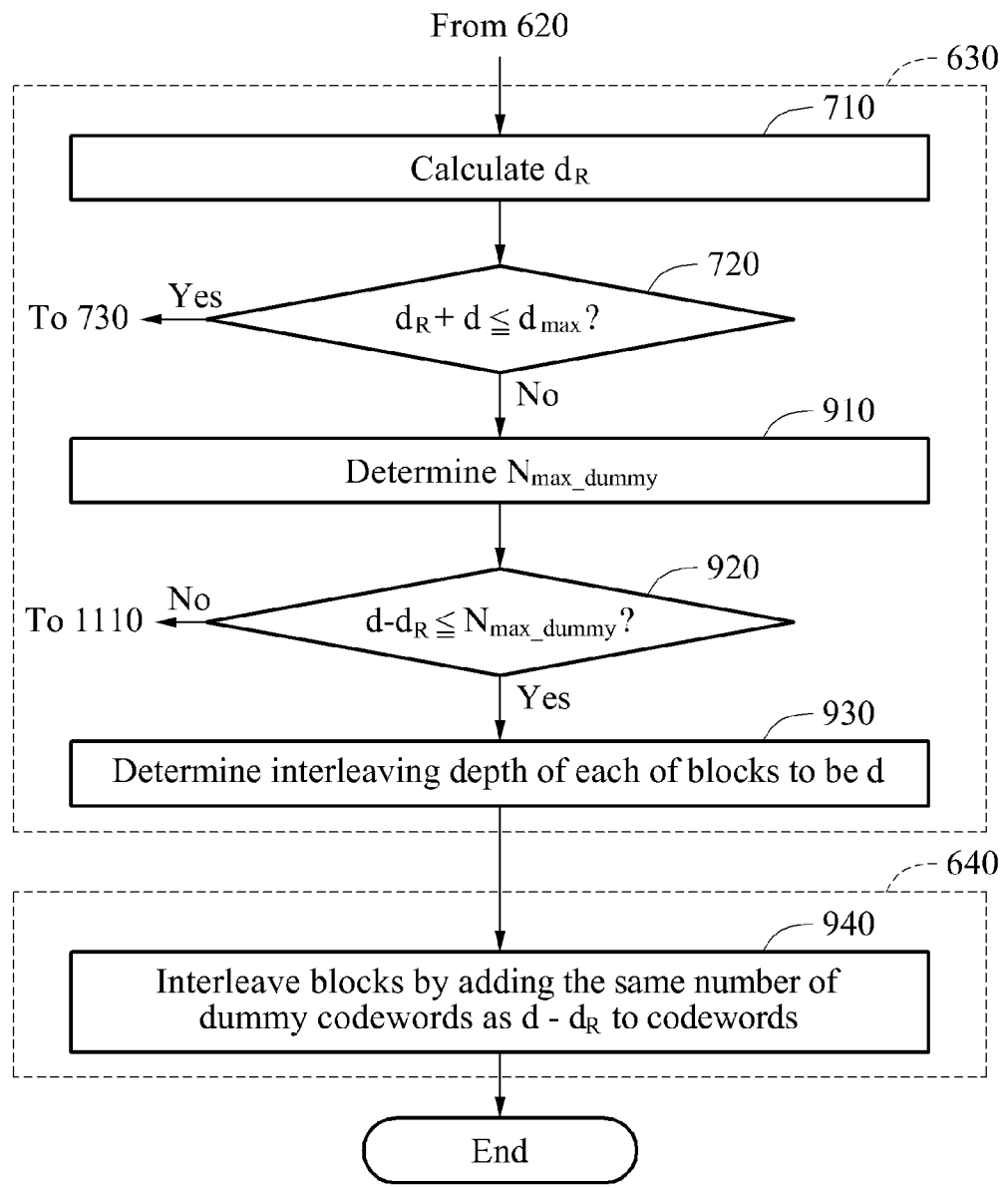
FIG. 9 illustrates an example of a method of performing interleaving when a difference between a basic interleaving depth and a number of remaining codewords is equal to or less than a maximum number of dummy codewords.

FIG. 9 illustrates an example of a method of performing interleaving when a difference between a basic interleaving depth d and a number of remaining codewords $d_R$ is equal to or less than a maximum number of dummy codewords $N_{max\_dummy}$.

The method of FIG. 9 is performed in the above-described case C.

Referring to FIG. 9, the operation of adaptively determining the interleaving depth of each of the interleaving blocks of operation 630 of FIG. 6 includes operations 710, 720, 910, 920 and 930.

When a sum of the number of the remaining codewords $d_R$ and the basic interleaving depth d is determined to exceed a maximum interleaving depth $d_{max}$ in operation 720, operation 910 is performed.

In operation 910, the interleaving depth determiner 320 determines, based on the number of the codewords, the maximum number of dummy codewords that are added to the codewords. The maximum number of the dummy codewords is represented by $N_{max\_dummy}$.

In an example, the interleaving depth determiner 320 determines the maximum number of the dummy codewords to be equal to or greater than a predetermined value of a data rate of transmission of codewords.

When an acceptable limit of a reduction in a data rate due to an addition of the dummy codewords is given as a system parameter A, the maximum number of the dummy codewords is determined to satisfy Equation 3, instead of exceeding the acceptable limit.

$$N_{max\_dummy} = \text{floor}(A \times N_{cw}) \quad \text{Equation 3}$$

In Equation 3, floor(x) denotes a value of a maximum integer that is not greater than x.

For example, when the system parameter A is "0.2" and $N_{cw}$ is "10," the maximum number of the dummy codewords is determined to be "2."

The interleaving depth determiner 320 determines a number of dummy codewords added to the codewords.

In an example, the interleaving depth determiner 320 determines a number of dummy codewords satisfying Equations 4 through 6 shown below.

$$N_{dummy} + d_R \leq d \quad \text{Equation 4}$$

In Equation 4, $N_{dummy}$ denotes a number of dummy codewords that are finally added.

$$N_{dummy}/N_{cw} \leq A \quad \text{Equation 5}$$

$$N_{dummy} = \min(\text{floor}(A \times N_{cw}), d - d_R) \quad \text{Equation 6}$$

In Equation 6, min(a,b) denotes a minimum value among a and b.

In operation 920, the interleaving depth determiner 320 compares a difference between the basic interleaving depth d and the number of the remaining codewords $d_R$ to the maximum number of the dummy codewords $N_{max\_dummy}$.

For example, the interleaving depth determiner 320 determines whether an interleaving depth of a last block to be the basic interleaving depth, by adding the dummy codewords to the remaining codewords.

When the difference between the basic interleaving depth d and the number of the remaining codewords $d_R$ is equal to or less than the maximum number of the dummy codewords $N_{max\_dummy}$, operation 930 is performed.

Figure 11:
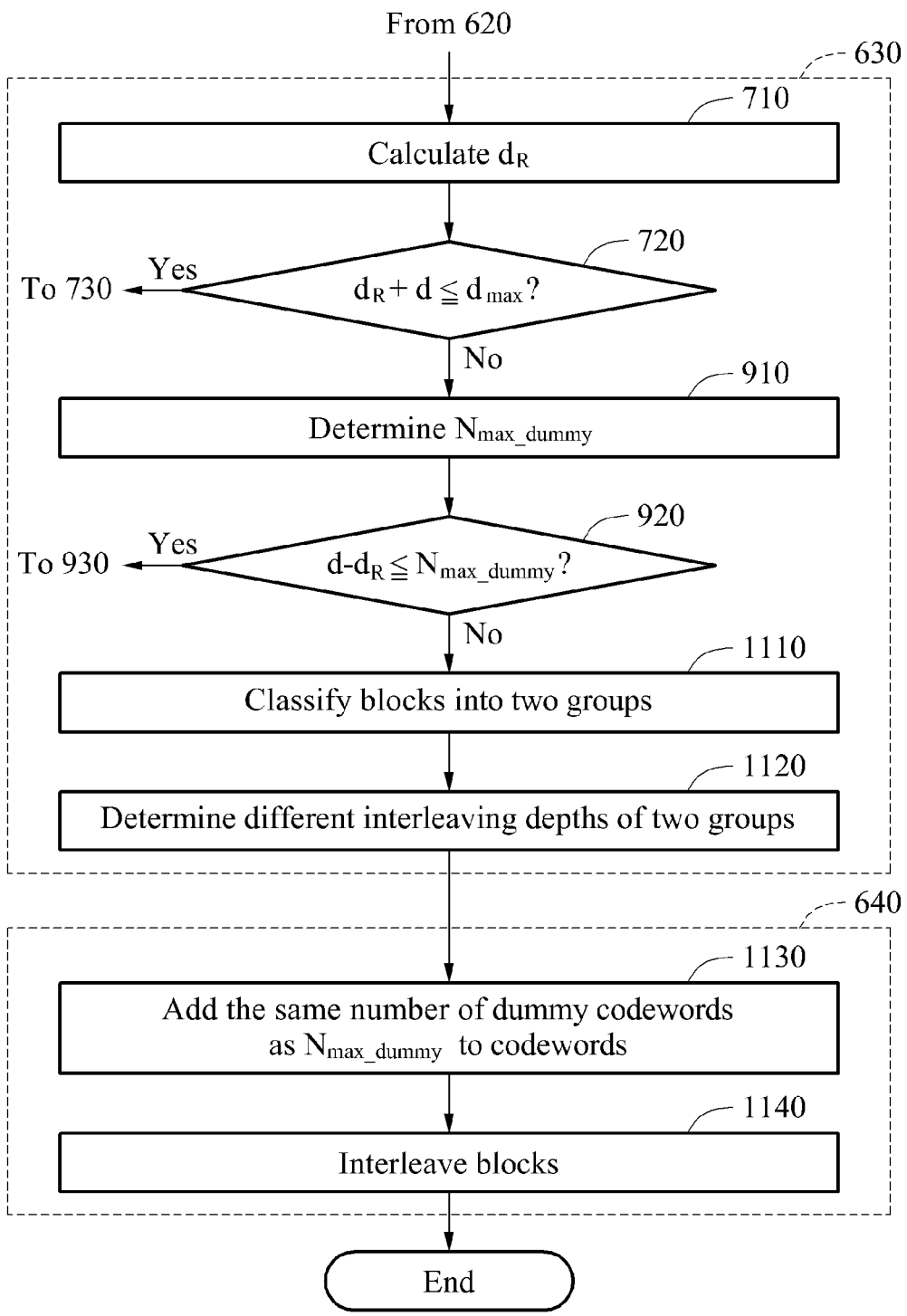
FIG. 11 illustrates an example of a method of performing interleaving when the difference between the basic interleaving depth and the number of the remaining codewords exceeds the maximum number of the dummy codewords.

When the difference between the basic interleaving depth d and the number of the remaining codewords $d_R$ exceeds the maximum number of the dummy codewords $N_{max\_dummy}$, operation 1110 of FIG. 11 is performed. Operation 1110 will be further described with reference to FIG. 11.

In operation 930, the interleaving depth determiner 320 determines an interleaving depth of each of the interleaving blocks to be the basic interleaving depth d.

When the difference between the basic interleaving depth d and the number of the remaining codewords $d_R$ is equal to or less than the maximum number of the dummy codewords $N_{max\_dummy}$, a relationship among the number of the codewords, a total number of the codewords including the dummy codewords, the basic interleaving depth, the number of the remaining codewords, and the number of the dummy codewords is represented by Equation 7 shown below.

$$N_{cw,dummy} = d \times (N_B - 1) + (d_R + N_{dummy}) \quad \text{Equation 7}$$

In Equation 7, $N_{cw,dummy}$ denotes a total number of codewords. When a value of "$d_R + N_{dummy}$" is equal to a value of d, Equation 7 is represented by Equation 8 shown below.

$$N_{cw,dummy} = (d \times N_B) \quad \text{Equation 8}$$

Operation 640 of FIG. 6 includes operation 940 of FIG. 9.

Referring back to FIG. 9, in operation 940, the interleaver 330 interleaves the interleaving blocks by adding the same number of dummy codewords as the difference to the codewords. For example, the interleaver 330 generates a last interleaving block by adding the same number of dummy codewords as the difference to the remaining codewords, and interleaves the last interleaving block.

The added dummy codewords are generated by zero padding.

Figure 10:
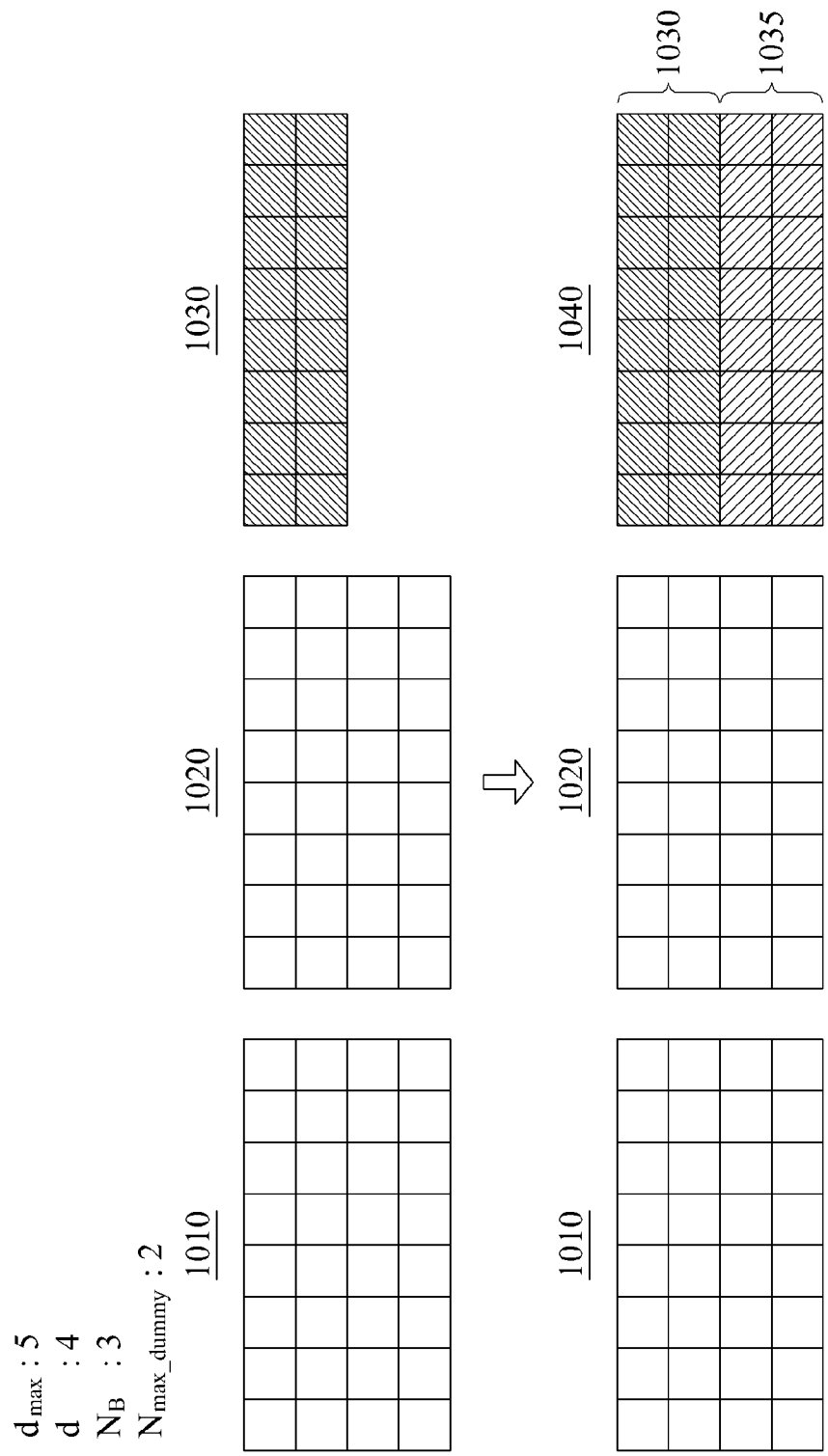
FIG. 10 illustrates an example of interleaving blocks generated when the difference between the basic interleaving depth and the number of the remaining codewords is equal to or less than the maximum number of the dummy codewords.

FIG. 10 illustrates an example of interleaving blocks generated when the difference between the basic interleaving depth and the number of remaining codewords is equal to or less than the maximum number of the dummy codewords.

Referring to FIG. 10, when ten codewords exist and the basic interleaving depth d is set to "4," blocks 1010 through 1030 are generated.

When two codewords remain, and when the basic interleaving depth is set to "4," a difference between the number of the remaining codewords and the basic interleaving depth is "2." When a maximum number of dummy codewords is set to "2," the difference is equal to the maximum number of the dummy codewords.

The interleaving depth determiner 320 determines an interleaving depth of each of all interleaving blocks to be the basic interleaving depth, that is, "4."

The interleaver 330 generates a last interleaving block 1040 by adding two dummy codewords 1035 to remaining codewords 1030.

The interleaver 330 interleaves the blocks 1010, 1020 and 1040.

In case C, each of all interleaving blocks includes an equal number of codewords, in response to a last interleaving block not having the basic interleaving depth even though a dummy codeword is added. In case D, each of last two interleaving blocks includes codewords to have a balance between the last two interleaving blocks, in response to a last interleaving block not having the basic interleaving depth even though a dummy codeword is added. In an example, when the sum of codewords of the last two interleaving blocks is 8, each of the last two interleaving blocks includes 4 codewords. In another example, when the sum of codewords of the last two interleaving blocks is 7, the one of the last two interleaving blocks includes 4 codewords and another interleaving block includes 3 codewords.

FIG. 11 illustrates an example of a method of performing interleaving when a difference between a basic interleaving depth and a number of remaining codewords exceeds a maximum number of dummy codewords.

The method of FIG. 11 may be performed in the above-described case C and case D.

Referring to FIG. 11, the operation of adaptively determining the depth of each of the interleaving blocks of operation 630 of FIG. 6 includes operations 710, 720, 910, 920, 1110 and 1120.

When the difference between a basic interleaving depth d and a number of remaining codewords $d_R$ is determined to exceed the maximum number of the dummy codewords $N_{max\_dummy}$ in operation 920, operation 1110 is performed.

In operation 1110, the interleaving depth determiner 320 classifies the interleaving blocks into two groups.

In operation 1120, the interleaving depth determiner 320 determines different interleaving depths of the two groups.

In an example, a difference between the different interleaving depths may be "1." In other words, the above-described case C may be taken into consideration.

When the difference between the basic interleaving depth d and the number of the remaining codewords $d_R$ exceeds the maximum number of the dummy codewords $N_{max\_dummy}$, a total number of codewords is expressed using Equations 9 through 11 shown below.

$$p = \text{floor}(N_{cw,dummy}/N_B) \quad \text{Equation 9}$$

$$q = \text{mod}(N_{cw,dummy}/N_B) \quad \text{Equation 10}$$

$$N_{cw,dummy} = p \times N_B + q \quad \text{Equation 11}$$

Equation 11 may be transformed to Equation 12 as shown below.

$$N_{cw,dummy} = (p+1) \times q + p \times (N_B - q) \quad \text{Equation 12}$$

The interleaving depth determiner 320 distributes "p+1" codewords to each of q interleaving blocks using Equation 12, and distributes p codewords to each of the other interleaving blocks, that is, "$N_B-q$" interleaving blocks. The q interleaving blocks are included in a first group, and the "$N_B-q$" interleaving blocks are included in a second group.

An interleaving depth of a group to which the "p+1" codewords are distributed is adjusted to "p+1." An interleaving depth of an interleaving block to which the p codewords are distributed is adjusted to "p." A value of "p+1" may be equal to or less than the maximum interleaving depth, and may be, for example, the basic interleaving depth.

Case C described above with reference to FIGS. 9 and 10 indicates a case in which a value of q is equal to "0" and a value of p is equal to d in Equation 12, and is a special case of case C described above with reference to FIG. 11.

In an example, the interleaving depth determiner 320 determines an interleaving depth of each of the preceding blocks to be greater than an interleaving depth of each of the following blocks among one or more interleaving blocks. A difference between a number of codewords included in the preceding blocks and a number of codewords included in the following blocks may be "1."

In another example, in operation 1110, the last two blocks among the interleaving blocks may be included in the first group, and the other blocks may be included in the second group. In other words, the above-described case D may be taken into consideration.

In this example, the interleaving depth determiner 320 determines an interleaving depth of each of the blocks in the second group to be the basic interleaving depth in operation 1120.

The interleaving depth determiner 320 determines an interleaving depth of each of the interleaving blocks in the first group, based on the basic interleaving depth, the number of the remaining codewords, and a number of added dummy codewords.

In an example, when a sum of the basic interleaving depth, the number of the remaining codewords, and the number of the added dummy codewords is an even number, the interleaving depth determiner 320 determines the interleaving blocks in the first group to have equal interleaving depths.

In another example, when the sum of the basic interleaving depth, the number of the remaining codewords, and the number of the added dummy codewords is an odd number, the interleaving depth determiner 320 determines the interleaving blocks in the first group to have different interleaving depths.

When the difference between the basic interleaving depth and the number of the remaining codewords exceeds the maximum number of the dummy codewords, Equation 7 is also applied.

Equation 7 may be transformed to Equation 13 as shown below.

$$N_{cw,dummy} = d \times (N_B - 2) + (d + d_R + N_{dummy}) \quad \text{Equation 13}$$

The interleaving depth determiner 320 determines an interleaving depth of a second group including "$N_B-2$" interleaving blocks to be the basic interleaving depth. Also, the interleaving depth determiner 320 determines an interleaving depth of a first group including the last two blocks based on a value of "$d+d_r+N_{dummy}$."

In an example, when the value of "$d+d_r+N_{dummy}$" is an even number, an interleaving depth of each of the interleaving blocks in the first group is determined to have a value of "$(d+d_r+N_{dummy})/2$."

In another example, when the value of "$d+d_r+N_{dummy}$" is an odd number, an interleaving depth of a single block is determined to have a value of "$\text{floor}((d+d_r+N_{dummy})/2)$," and an interleaving depth of each of the other blocks is determined to have a value of "$\text{floor}((d+d_r+N_{dummy})/2)+1$."

The operation of interleaving the interleaving blocks of operation 640 of FIG. 6 includes operations 1130 and 1140 of FIG. 11.

In operation 1130, the interleaver 330 adds the same number of dummy codewords as the maximum number of the dummy codewords to the codewords.

In operation 1140, the interleaver 330 interleaves the interleaving blocks by applying different interleaving depths to the two groups.

In case C, the interleaver 330 interleaves q interleaving blocks using "p+1" codewords, and interleaves the other interleaving blocks, that is, "$N_B-q$" interleaving blocks, using p codewords.

In case D, the interleaver 330 interleaves the last two blocks based on an interleaving depth determined for each of the last two blocks, and interleaves the other blocks based on the basic interleaving depth.

The description of FIGS. 1 through 10 is equally applicable to the method of FIG. 11 and accordingly, will not be repeated.

Figure 12:
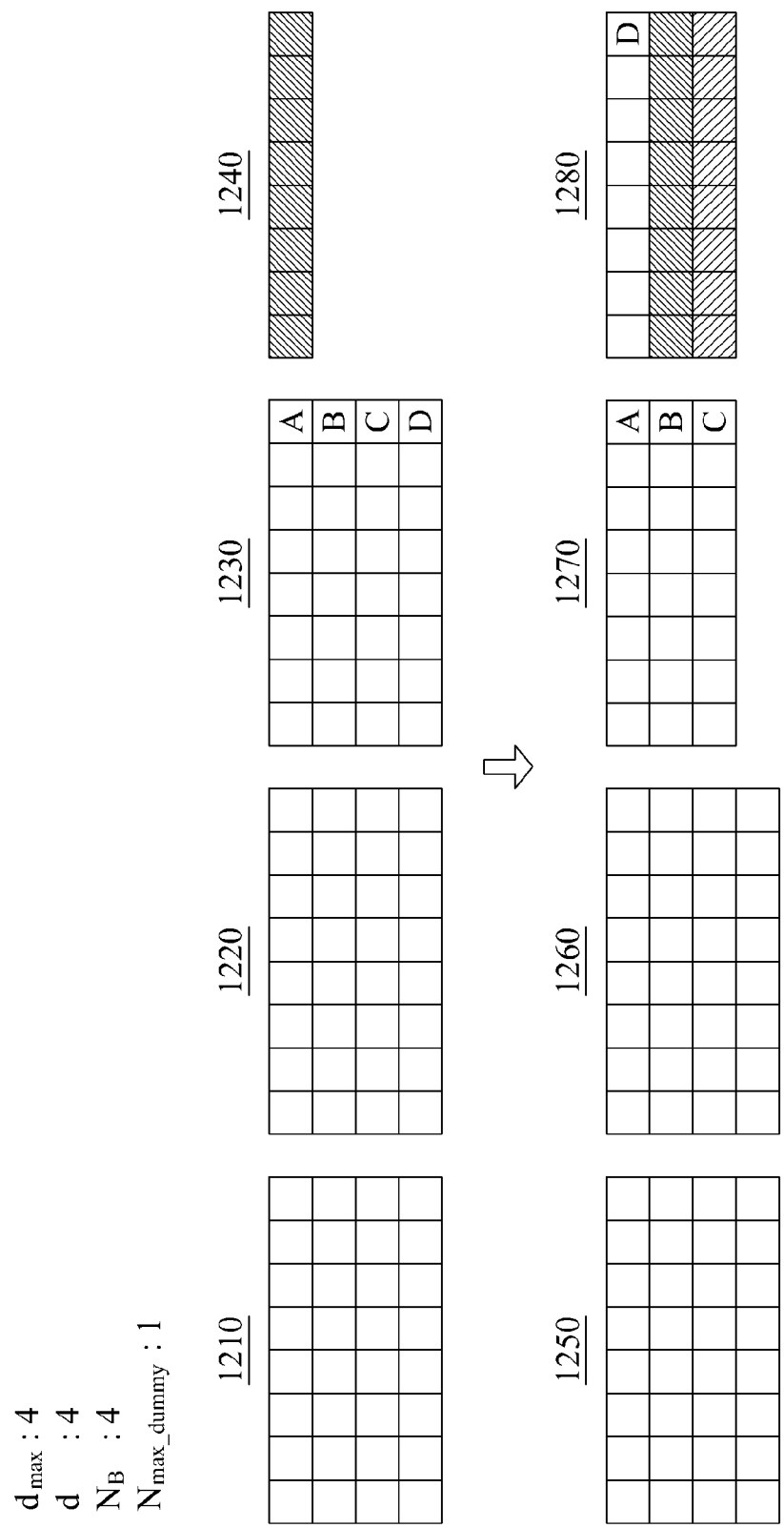
FIG. 12 illustrates an example of interleaving blocks generated when the difference between the basic interleaving depth and the number of the remaining codewords exceeds the maximum number of the dummy codewords.

FIG. 12 illustrates an example of interleaving blocks generated when the difference between the basic interleaving depth and the number of the remaining codewords exceeds the maximum number of the dummy codewords.

Referring to FIG. 12, when 12 codewords exist and the basic interleaving depth d is set to "4," blocks 1210 through 1240 are generated.

When the maximum number of the dummy codewords is set to "1," a last block 1240 may be incomplete.

In case C, using Equation 12, a first group of which an interleaving depth of "p+1" is determined includes blocks 1250 and 1260, and a second group of which an interleaving depth of p is determined includes blocks 1270 and 1280.

In case D, using Equation 13, a second group of which an interleaving depth is determined to be the basic interleaving depth includes blocks 1250 and 1260, and a first group of which an interleaving depth is determined based on a value of "$d+d_r+N_{dummy}$" includes blocks 1270 and 1280. In the example of FIG. 12, the value of "$d+d_r+N_{dummy}$" is "6," that is, an even number, and accordingly the blocks 1270 and 1280 may have equal interleaving depths, that is, "3."

In the another example, when dmax is 4, d is 5, NB is 4, Nmax_dummy is 1, each of blocks 1210, 1220, 1230 has 5 codewords and block 1240 has 1 codeword, each of interleaving blocks 1250 and 1260 has 5 codewords, and interleaving block 1270 has 4 codewords and the interleaving blocks 1280 has 3 codewords.

In case E, a number of codewords is less than a basic interleaving depth.

Figure 13:
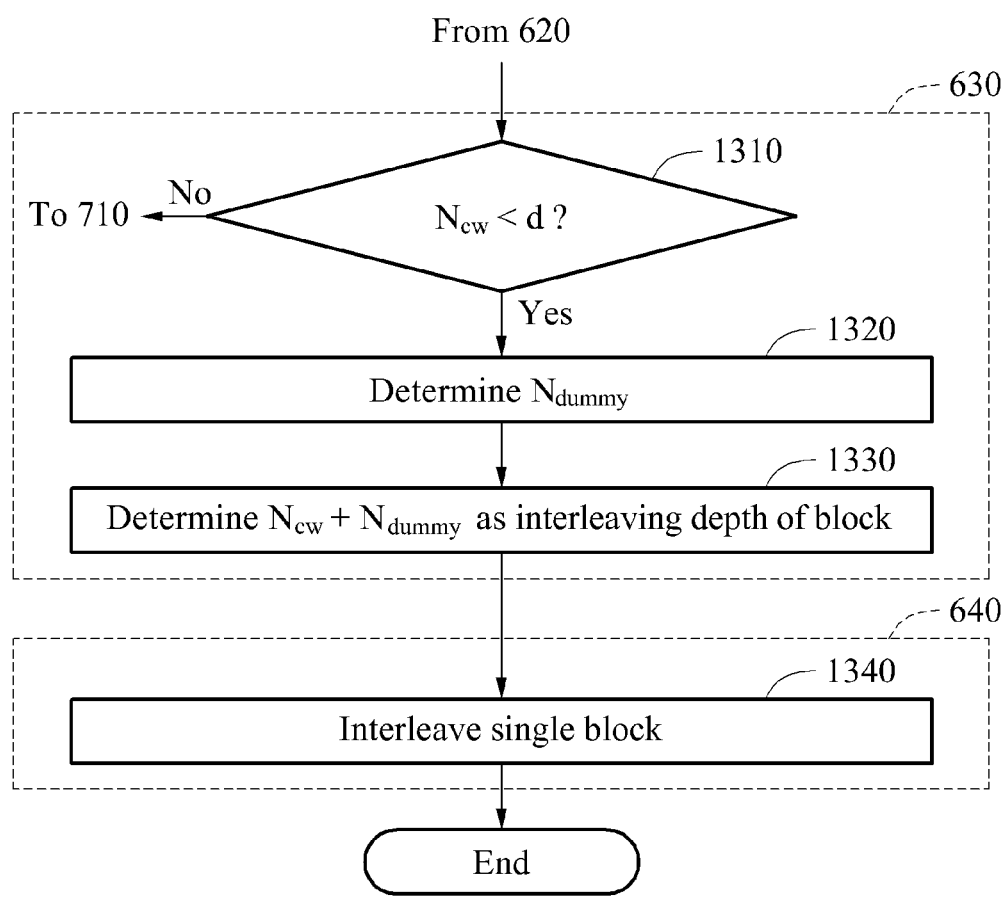
FIG. 13 illustrates an example of a method of performing interleaving when a number of codewords is less than a predetermined basic interleaving depth.

FIG. 13 illustrates an example of a method of performing interleaving when a number of codewords is less than a predetermined basic interleaving depth.

The method of FIG. 13 is performed in the above-described case E. In case E, a single interleaving block is interleaved.

Referring to FIG. 13, operation 630 of FIG. 6 includes operations 1310 through 1330.

In operation 1310, the interleaving depth determiner 320 compares the number of the codewords $N_{cw}$ to the basic interleaving depth d.

When the number of the codewords is less than the basic interleaving depth, operation 1320 is performed.

When the number of the codewords is equal to or greater than the basic interleaving depth, operation 710 of FIG. 7 is performed.

In operation 1320, the interleaving depth determiner 320 determines a number of the dummy codewords $N_{dummy}$ added to the codewords.

For example, the interleaving depth determiner 320 determines the number of the added dummy codewords using Equations 4 through 6.

In operation 1330, the interleaving depth determiner 320 determines a sum of the number of the codewords $N_{cw}$ and the number of the dummy codewords $N_{dummy}$ as an interleaving depth of an interleaving block.

Operation 640 of FIG. 6 includes operation 1340.

In operation 1340, the interleaver 330 interleaves an interleaving block, based on the codewords and the added dummy codewords.

Figure 14:
FIG. 14 illustrates an example of interleaving blocks generated when the number of the codewords is less than the predetermined basic interleaving depth.

FIG. 14 illustrates an example of interleaving blocks generated when the number of the codewords is less than the predetermined basic interleaving depth.

Referring to FIG. 14, when three codewords exist and the basic interleaving depth d is set to "4," a block 1410 is generated.

By adding a single dummy codeword to the block 1410, a block 1420 is generated.

The units described herein may be implemented using hardware components, software components, or a combination thereof. For example, the hardware components may include microphones, amplifiers, band-pass filters, audio to digital convertors, and processing devices. A processing device may be implemented using one or more general-purpose or special purpose computers, such as, for example, a processor, a controller and an arithmetic logic unit, a digital signal processor, a microcomputer, a field programmable array, a programmable logic unit, a microprocessor or any other device capable of responding to and executing instructions in a defined manner. The processing device may run an operating system (OS) and one or more software applications that run on the OS. The processing device also may access, store, manipulate, process, and create data in response to execution of the software. For purpose of simplicity, the description of a processing device is used as singular; however, one skilled in the art will appreciated that a processing device may include multiple processing elements and multiple types of processing elements. For example, a processing device may include multiple processors or a processor and a controller. In addition, different processing configurations are possible, such a parallel processors.

The software may include a computer program, a piece of code, an instruction, or some combination thereof, to independently or collectively instruct or configure the processing device to operate as desired. Software and data may be embodied permanently or temporarily in any type of machine, component, physical or virtual equipment, computer storage medium or device, or in a propagated signal wave capable of providing instructions or data to or being interpreted by the processing device. The software also may be distributed over network coupled computer systems so that the software is stored and executed in a distributed fashion. The software and data may be stored by one or more non-transitory computer readable recording mediums.

The non-transitory computer readable recording medium may include any data storage device that can store data which can be thereafter read by a computer system or processing device. Examples of the non-transitory computer readable recording medium include read-only memory (ROM), random-access memory (RAM), CD-ROMs, magnetic tapes, floppy disks, optical data storage devices, and the like. Also, functional programs, codes, and code segments that accomplish the examples disclosed herein can be easily construed by programmers skilled in the art to which the examples pertain based on and using the flow diagrams and block diagrams of the figures and their corresponding descriptions as provided herein.

As a non-exhaustive illustration only, a terminal or device described herein may refer to mobile devices such as a cellular phone, a personal digital assistant (PDA), a digital camera, a portable game console, and an MP3 player, a portable/personal multimedia player (PMP), a handheld e-book, a portable laptop PC, a global positioning system (GPS) navigation, a tablet, a sensor, and devices such as a desktop PC, a high definition television (HDTV), an optical disc player, a setup box, a home appliance, and the like that are capable of wireless communication or network communication consistent with that which is disclosed herein.

A number of examples have been described above. Nevertheless, it should be understood that various modifications may be made. For example, suitable results may be achieved if the described techniques are performed in a different order and/or if components in a described system, architecture, device, or circuit are combined in a different manner and/or replaced or supplemented by other components or their equivalents. Accordingly, other implementations are within the scope of the following claims.

The apparatus illustrated in FIGS. 1 and 3 that perform the operations described herein with respect to FIGS. 4-14 are implemented by hardware components. Examples of hardware components include controllers, sensors, generators, drivers, and any other electronic components known to one of ordinary skill in the art. In one example, the hardware components are implemented by one or more processors or computers. A processor or computer is implemented by one or more processing elements, such as an array of logic gates, a controller and an arithmetic logic unit, a digital signal processor, a microcomputer, a programmable logic controller, a field-programmable gate array, a programmable logic array, a microprocessor, or any other device or combination of devices known to one of ordinary skill in the art that is capable of responding to and executing instructions in a defined manner to achieve a desired result. In one example, a processor or computer includes, or is connected to, one or more memories storing instructions or software that are executed by the processor or computer. Hardware components implemented by a processor or computer execute instructions or software, such as an operating system (OS) and one or more software applications that run on the OS, to perform the operations described herein with respect to FIGS. 1 and 3. The hardware components also access, manipulate, process, create, and store data in response to execution of the instructions or software. For simplicity, the singular term "processor" or "computer" may be used in the description of the examples described herein, but in other examples multiple processors or computers are used, or a processor or computer includes multiple processing elements, or multiple types of processing elements, or both. In one example, a hardware component includes multiple processors, and in another example, a hardware component includes a processor and a controller. A hardware component has any one or more of different processing configurations, examples of which include a single processor, independent processors, parallel processors, single-instruction single-data (SISD) multiprocessing, single-instruction multiple-data (SIMD) multiprocessing, multiple-instruction single-data (MISD) multiprocessing, and multiple-instruction multiple-data (MIMD) multiprocessing.

The methods illustrated in FIGS. 4-14 that perform the operations described herein with respect to FIGS. 1 and 3 are performed by a processor or a computer as described above executing instructions or software to perform the operations described herein.

Instructions or software to control a processor or computer to implement the hardware components and perform the methods as described above are written as computer programs, code segments, instructions or any combination thereof, for individually or collectively instructing or configuring the processor or computer to operate as a machine or special-purpose computer to perform the operations performed by the hardware components and the methods as described above. In one example, the instructions or software include machine code that is directly executed by the processor or computer, such as machine code produced by a compiler. In another example, the instructions or software include higher-level code that is executed by the processor or computer using an interpreter. Programmers of ordinary skill in the art can readily write the instructions or software based on the block diagrams and the flow charts illustrated in the drawings and the corresponding descriptions in the specification, which disclose algorithms for performing the operations performed by the hardware components and the methods as described above.

The instructions or software to control a processor or computer to implement the hardware components and perform the methods as described above, and any associated data, data files, and data structures, are recorded, stored, or fixed in or on one or more non-transitory computer-readable storage media. Examples of a non-transitory computer-readable storage medium include read-only memory (ROM), random-access memory (RAM), flash memory, CD-ROMs, CD-Rs, CD+Rs, CD-RWs, CD+RWs, DVD-ROMs, DVD-Rs, DVD+Rs, DVD-RWs, DVD+RWs, DVD-RAMs, BD-ROMs, BD-Rs, BD-R LTHs, BD-REs, magnetic tapes, floppy disks, magneto-optical data storage devices, optical data storage devices, hard disks, solid-state disks, and any device known to one of ordinary skill in the art that is capable of storing the instructions or software and any associated data, data files, and data structures in a non-transitory manner and providing the instructions or software and any associated data, data files, and data structures to a processor or computer so that the processor or computer can execute the instructions. In one example, the instructions or software and any associated data, data files, and data structures are distributed over network-coupled computer systems so that the instructions and software and any associated data, data files, and data structures are stored, accessed, and executed in a distributed fashion by the processor or computer.

While this disclosure includes specific examples, it will be apparent to one of ordinary skill in the art that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. A processor-implemented interleaving method in a communication system using interleaving, the method comprising:
   determining, using an interleaving processor of a transmitter in the communication system, an interleaving depth, as a basic interleaving depth, of each of one or more blocks based on a maximum interleaving depth and a number of codewords of a packet to be transmitted;
   performing, using the interleaving processor, a first interleaving for the blocks based on the basic interleaving depth;
   calculating, using the interleaving processor, a number of remaining codewords that remain after the first interleaving;
   adaptively adjusting, using the interleaving processor, the interleaving depth to be updated based on the basic interleaving depth and the calculated number of the remaining codewords;
   performing, using the interleaving processor, a second interleaving corresponding to the remaining codewords, based on the adaptively adjusted interleaving depth; and
   transmitting, using a communicating processor of the transmitter, interleaved blocks of the packet to a receiver in the communication system, the interleaved blocks being generated based on results of the respective performing of the first interleaving and the second interleaving.

2. The interleaving method of claim 1, wherein the maximum interleaving depth is a value set in advance between the transmitter configured to transmit the interleaved blocks and the receiver configured to receive the interleaved blocks.

3. The interleaving method of claim 1, wherein the basic interleaving depth is determined based on an environment of a communication channel through which the interleaved blocks are transmitted in the communication system.

4. The interleaving method of claim 1, wherein the interleaving depth is adaptively adjusted, based on a sum of the number of the remaining codewords and the basic interleaving depth, for the performing of the second interleaving.

5. The interleaving method of claim 4,
   wherein the adaptively adjusting of the interleaving depth further comprises, in response to the sum being equal to or less than the maximum interleaving depth, determining, an interleaving depth for a last block, of the blocks, to be generated to be equal to the sum, and determining an interleaving depth for each of another blocks, of the blocks, other than the last block to be the basic interleaving depth, and
   wherein the performing of the second interleaving comprises interleaving the last interleaving block based on a same number of codewords as the sum, and the performing of the first interleaving comprises interleaving the other blocks based on the same number of codewords as the basic interleaving depth.

6. The interleaving method of claim 4, wherein the adaptively adjusting of the interleaving depth further comprises:
   determining a maximum number of dummy codewords based on the number of the codewords, in response to the sum exceeding the maximum interleaving depth, the dummy codewords being added to the codewords; and
   determining the interleaving depth to be the basic interleaving depth, in response to a difference between the basic interleaving depth and the number of the remaining codewords being equal to or less than the maximum number of dummy codewords, and
   wherein the performing of the first interleaving comprises interleaving the blocks by adding the same number of dummy codewords as the difference to the codewords.

7. The interleaving method of claim 6, wherein the dummy codewords are generated by zero padding.

8. The interleaving method of claim 4, wherein the blocks comprise a plurality of interleaving blocks,
   wherein the adaptively adjusting of the interleaving depth further comprises:
      determining a maximum number of dummy codewords based on the number of the codewords, in response to the sum exceeding the maximum interleaving depth, the dummy codewords being added to the codewords;
      classifying the interleaving blocks into two groups, in response to a difference between the basic interleaving depth and the number of the remaining codewords exceeding the maximum number of dummy codewords; and
      determining different interleaving depths of the two groups, and
   wherein the interleaving comprises:
      adding the same number of dummy codewords as the maximum number of dummy codewords to the codewords; and
      interleaving the interleaving blocks by applying the different interleaving depths respectively to the two groups.

9. The interleaving method of claim 8, wherein a difference between the different interleaving depths of the two groups is "1".

10. The interleaving method of claim 8, wherein an interleaving depth of a preceding group among the two groups is greater than an interleaving depth of a following group.

11. The interleaving method of claim 8, wherein the determining of the different interleaving depths comprises:
   in response to last two interleaving blocks among the interleaving blocks being included in a first group, and the other interleaving blocks being included in a second group, determining an interleaving depth of each of the interleaving blocks in the second group to be the basic interleaving depth; and
   determining an interleaving depth of each of the interleaving blocks in the first group, based on the basic interleaving depth, a number of remaining codewords from the first group, and a number of the added dummy codewords.

12. The interleaving method of claim 11, wherein, in response to a sum of the basic interleaving depth, the number of the remaining codewords, and the number of the added dummy codewords being an even number, the interleaving blocks in the first group are determined to have identical interleaving depths.

13. The interleaving method of claim 1:
   wherein the adaptively adjusting of the interleaving depth comprises:
      determining a number of dummy codewords added to the codewords, in response to the number of the codewords being less than the basic interleaving depth; and determining the interleaving depth to be a sum of the number of the codewords and the number of the dummy codewords, and wherein the performing of the second interleaving comprises, in response to a single interleaving block existing, interleaving the blocks based on the number of the codewords and the number of the dummy codewords.

14. An transmitting apparatus in a communication system using interleaving, the apparatus comprising:

an interleaving depth determiner configured to determine an interleaving depth, as a basic interleaving depth, of each of one or more blocks based on a maximum interleaving depth and a number of codewords of a packet to be transmitted; and an interleaver configured to:

perform a first interleaving for the blocks based on the basic interleaving depth;

calculate a number of remaining codewords that remain after the first interleaving, the interleaving depth determiner configured to adaptively adjust the interleaving depth to be updated based on the basic interleaving depth and the calculated number of the remaining codewords;

the interleaver configured to perform a second interleaving of blocks corresponding to the remaining codewords, based on the adaptively adjusted interleaving depth; and a communicating processor configured to transmit interleaved blocks of the packet to a receiver in the communication system, the interleaved blocks being generated based on results of the respective performing of the first interleaving and the second interleaving.

15. The interleaving apparatus of claim 14 further comprising a maximum interleaving depth storage configured to store the maximum interleaving depth.

16. The interleaving apparatus of claim 14, wherein the interleaving depth determiner is further configured to determine the basic interleaving depth based on an environment of a communication channel through which interleaved blocks are transmitted.

* * * * *